United States Patent
Amie et al.

(10) Patent No.: US 6,850,413 B2
(45) Date of Patent: Feb. 1, 2005

(54) PC CARD

(75) Inventors: Masaki Amie, Iwata (JP); Fujio Arai, Yokohama (JP); Yukinari Inoue, Hamamatsu (JP); Hidenori Takeuchi, Hamakita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/131,884

(22) Filed: Apr. 25, 2002

(65) Prior Publication Data

US 2002/0159239 A1 Oct. 31, 2002

(30) Foreign Application Priority Data

Apr. 27, 2001 (JP) ..................................... P. 2001-131868

(51) Int. Cl.⁷ ................................................ H05K 1/14
(52) U.S. Cl. ....................... 361/737; 361/759; 361/801; 361/803; 361/816; 361/818
(58) Field of Search ................................. 361/737, 759, 361/801, 803, 816, 818, 800, 752

(56) References Cited

U.S. PATENT DOCUMENTS

| | | | | |
|---|---|---|---|---|
| 5,497,297 A | * | 3/1996 | Kilmer et al. | 361/737 |
| 6,160,711 A | * | 12/2000 | Gerrits et al. | 361/737 |
| 6,166,912 A | * | 12/2000 | Morii et al. | 361/737 |
| 6,527,188 B1 | * | 3/2003 | Shobara et al. | 235/486 |

* cited by examiner

*Primary Examiner*—Kamand Cuneo
*Assistant Examiner*—Thanh Y. Tran
(74) *Attorney, Agent, or Firm*—Pearne & Gordon LLP

(57) ABSTRACT

A PC card includes a frame, a board mounted on the frame, and an upper cover and a lower cover for respectively covering an upper side and a lower side of the frame, slits formed to be penetrated from an abutting plane between the upper cover and the side portion of the frame up to another abutting plane between the lower cover and the side portion of the frame, claws used for the upper cover and the lower cover provided on inner wall surfaces of the slits, insertion projections respectively provided on the upper cover and the lower cover and inserted into the slits, and holes respectively formed in the insertion projections of the upper cover and the lower cover and inserted into the slits so as to be engaged with the claws.

4 Claims, 11 Drawing Sheets

PC CARD

BACKGROUND OF THE INVENTION

The present invention is related to a PC card such as a PCMCIA (Personal Computer Memory Card International Association) card which is used for, for instance, an expansion function of a portable computer and a data communication thereof.

Figure 10:
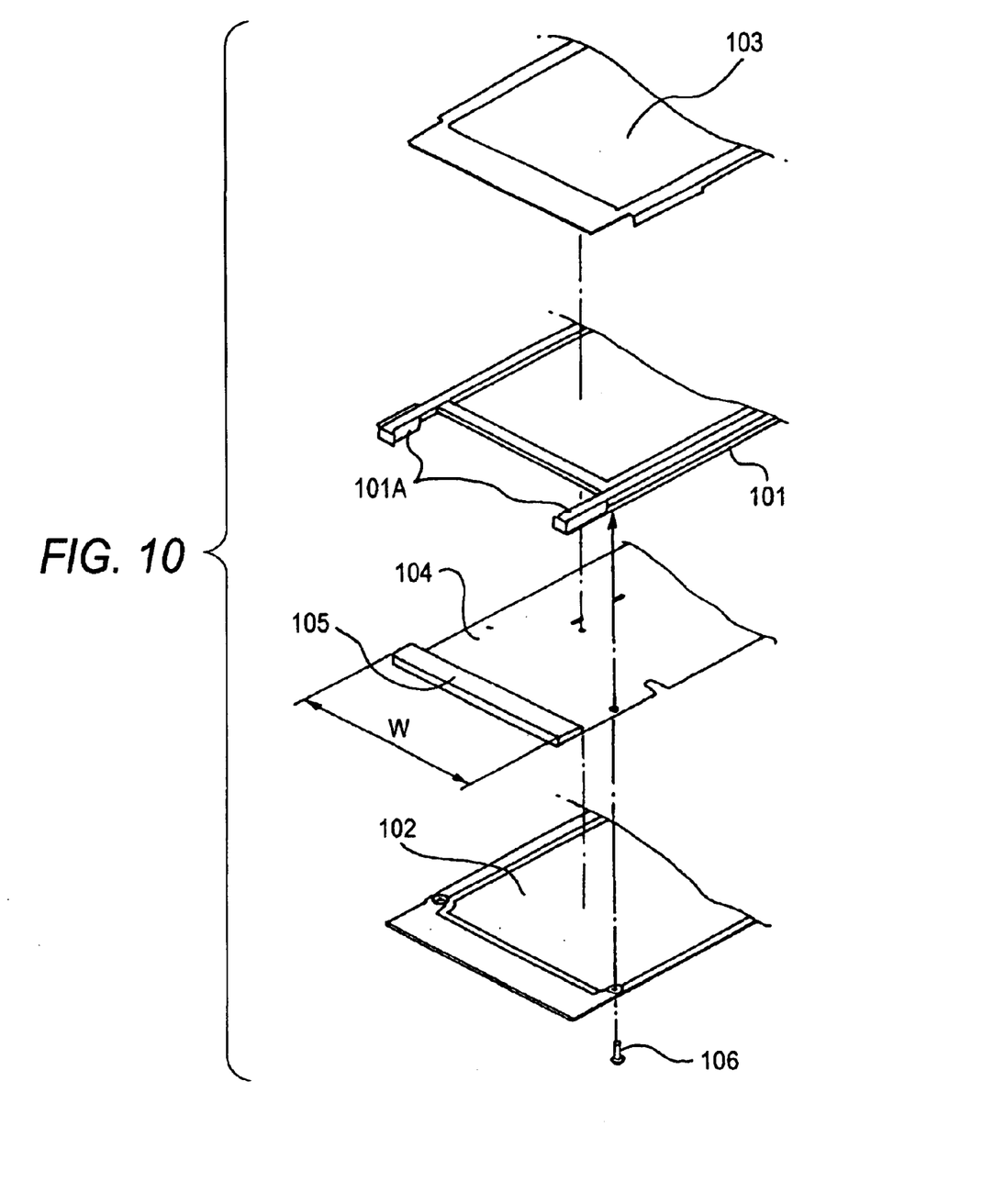
FIG. 10 is an exploded perspective view for indicating one conventional PC card.

As shown in FIG. 10, for example, a conventional PC card apparatus includes a frame 101, a lower cover 102, an upper cover 103, a board 104, and the like. The frame 101 is formed of synthetic resin and the like. The lower cover 102 is made of a metal, and covers a lower surface side of the frame 101. The upper cover 103 is made of a metal, and covers an upper surface side of the frame 101. The board 104 is stored in the frame 101, and various sorts of circuit components are mounted on the board 104. There are many cases that both the lower cover 102 and the upper cover 103 are fastened by employing a screw and the like with respect to the frame 101. On the other hand, this PC card is arranged by having a constant width size. More specifically, a connector 105 is formed on an edge portion of this PC card on a tip side thereof along an insertion direction of this PC card. There are many cases that a width "W" of this tip portion of the PC card is formed without any tolerance size. Normally, however, the tip portion of the PC card is fully occupied by the connector 105 and an elongated portion 101A along the width thereof, while this connector 105 is stored by the elongated portion 101A under such a condition that the elongated portion 101A sandwiches this connector 105 from both side portions thereof. Also, there is no extra space where the upper/lower covers are fastened on tip portion by a screw. As a result, there are many cases that a screw 106 is screwed at a portion which is slightly shifted from the tip portion to a base end portion so as to fix the upper/lower covers.

Figure 11:
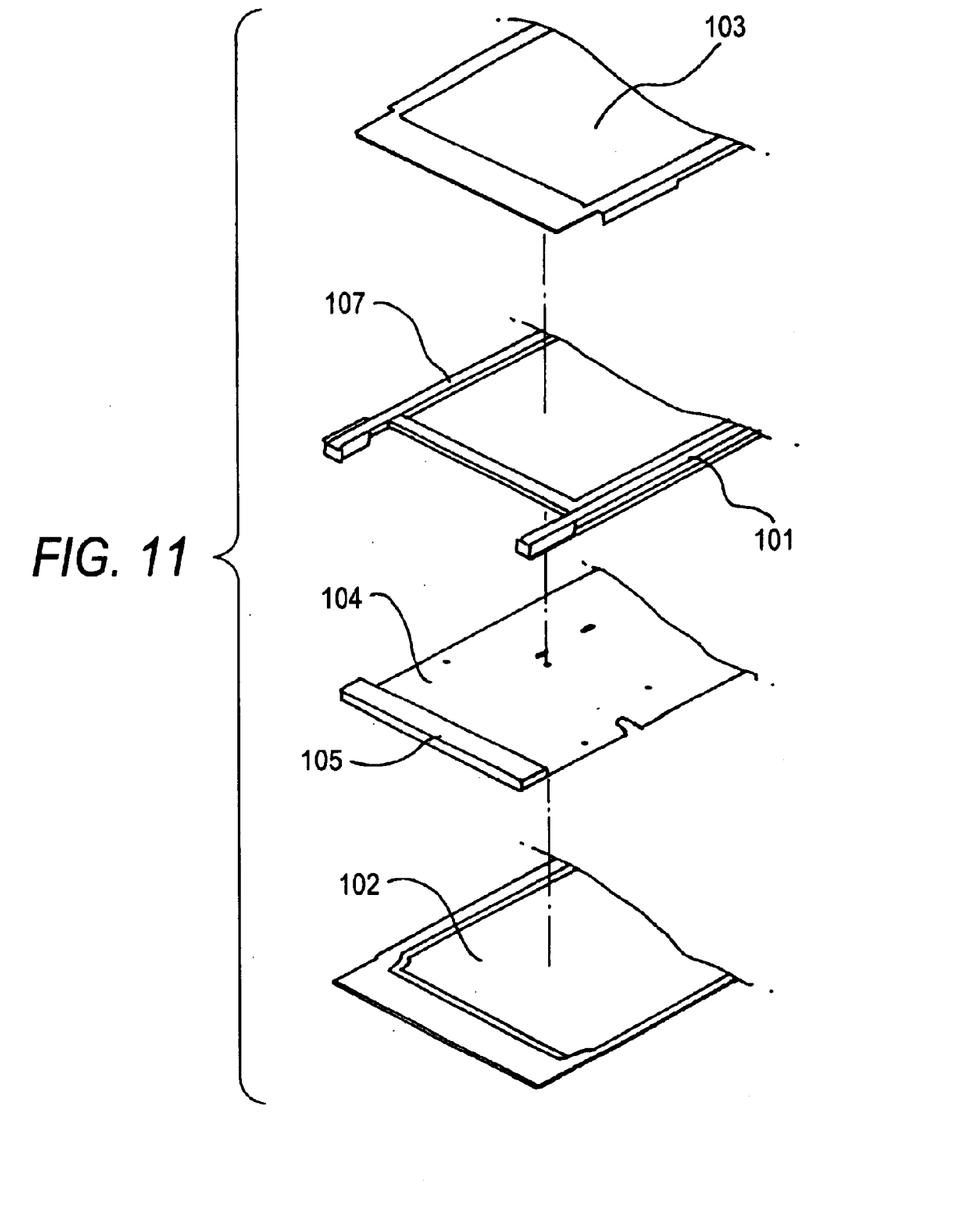
FIG. 11 is an exploded perspective view for showing another conventional PC card.

However, such a PC card in which the upper/lower covers are fixed by using the screw owns a problem. That is, clearances and torsion (twists) are easily made in the tip surface thereof. As a consequence, as indicated in FIG. 11, while a thermo-compression tape 107 is used, another PC card is known in which upper/lower covers are attached up to a tip portion of a frame so as to be fixed thereon.

However, as previously explained, as to the PC card with employment of such a thermo-compression tape, a facility such as a heat source is required in order to perform an adhesive work on the thermo-compression tape 107, which may therefore increase the manufacturing cost. Moreover, in such a type of PC card with employment of this thermo-compression tape, for example, in the case that a component of this PC card is brought into malfunction and the replacement of this component is required, the following works can be hardly carried out. That is, in this work, this thermo-compression tape is stripped, and the PC card is disassembled so as to open the internal construction of the PC card.

SUMMARY OF THE INVENTION

The present invention has been made to solve the above-described problem, and therefore, has an object to provide such a PC card capable of being readily disassembled, while tip portions of upper/lower covers can be joined to a frame of the PC card without using a thermo-compression tape and the like.

Firstly, a PC card according to the present invention is equipped with a frame made of synthetic resin; a board held by the frame, on which a circuit component and a connector connectable with an electronic appliance are mounted; and both an upper cover and a lower cover, which are made of metals and cover both an upper side and a lower side of the frame; while the PC card is used to be inserted into the electronic appliance, the PC card includes: slits formed in such a manner that the slits are penetrated from an abutting plane between the upper cover and a side portion of the frame up to another abutting plane between the lower cover and another side portion of the frame; engaged portions used for both the upper cover and the lower cover, which are provided on inner wall faces of the slits; insertion projections which are provided on both the upper cover and the lower cover, respectively, and are inserted into the slits; and engaging portions which are provided on both the insertion projections of the upper cover and the lower cover, respectively, and are inserted into the slits so as to be engaged with the engaged portions.

As a result, the PC card can be assembled without using the thermo-compression type and the like, and the frame can be simply disassembled so as to be opened.

Also, secondly, in the PC card of the present invention, extended portions for storing thereinto the connector are provided which are extended from both side portions of tip portions of the frame along an insertion direction, and are positioned at both side portions of the connector mounted on the board; and the slits may be formed in the extended portions.

As a result, the surrounding portions of the connector, more specifically, the tip surface sides of the connector along the insertion direction can be fixed without using adhesive agent, and it is possible to prevent deformations of the surrounding portions of the connector due to applications of twist stress.

Also, thirdly, in the PC card of the present invention, an inclined face may be preferably formed on a tip portion of the insertion projection of at least any one of the upper cover and the lower cover, while the inclined face guides the insertion operation into the slits.

As a consequence, operability of the insertion portions when the insertion portions are inserted into the slits can be improved. Moreover, destruction of the claws formed on the slits can be avoided.

Also, fourthly, in the PC card of the present invention, an inclined face may be preferably formed on an edge portion of an inner surface on the side of an insertion port of the slit, while the inclined face guides an insertion operation of an insertion projection tip portion of at least any one of the upper cover and the lower cover.

As a result, the operability of the insertion portions when the insertion portions are inserted into the slits can be further improved.

Also, fifthly, in the PC card of the present invention, the engaged portion may be constructed of a substantially triangle-pole-shaped claw; and the engaged portion may be a hole which is fitted into the claw.

Also, sixthly, in the PC card of the present invention, the claw may preferably contain an inclined face for guiding the insertion operation of the insertion projection; and a raised face for engaging the inserted hole, located perpendicular to an inner surface of the slit.

As a consequence, the inserting operations of the insertion projections can be smoothly carried out, and also, it is possible to avoid such a fact that the insertion projections come out unnecessarily.

Also, seventhly, in the PC card of the present invention, a tapered face may be preferably formed on an inner peripheral edge portion of the hole of the insertion projection, while the tapered face is inclined with respect to a thickness direction of the insertion projection, and guides a dismounting operation from the claw.

As a result, the dismounting works of the insertion projections can be carried out in a smooth manner.

DETAILED DESCRIPTION OF THE PREFERRED EMBODIMENT

Referring now to the accompanying drawings, embodiment modes of the present invention will be described in detail.

[Embodiment 1]

Figure 1:
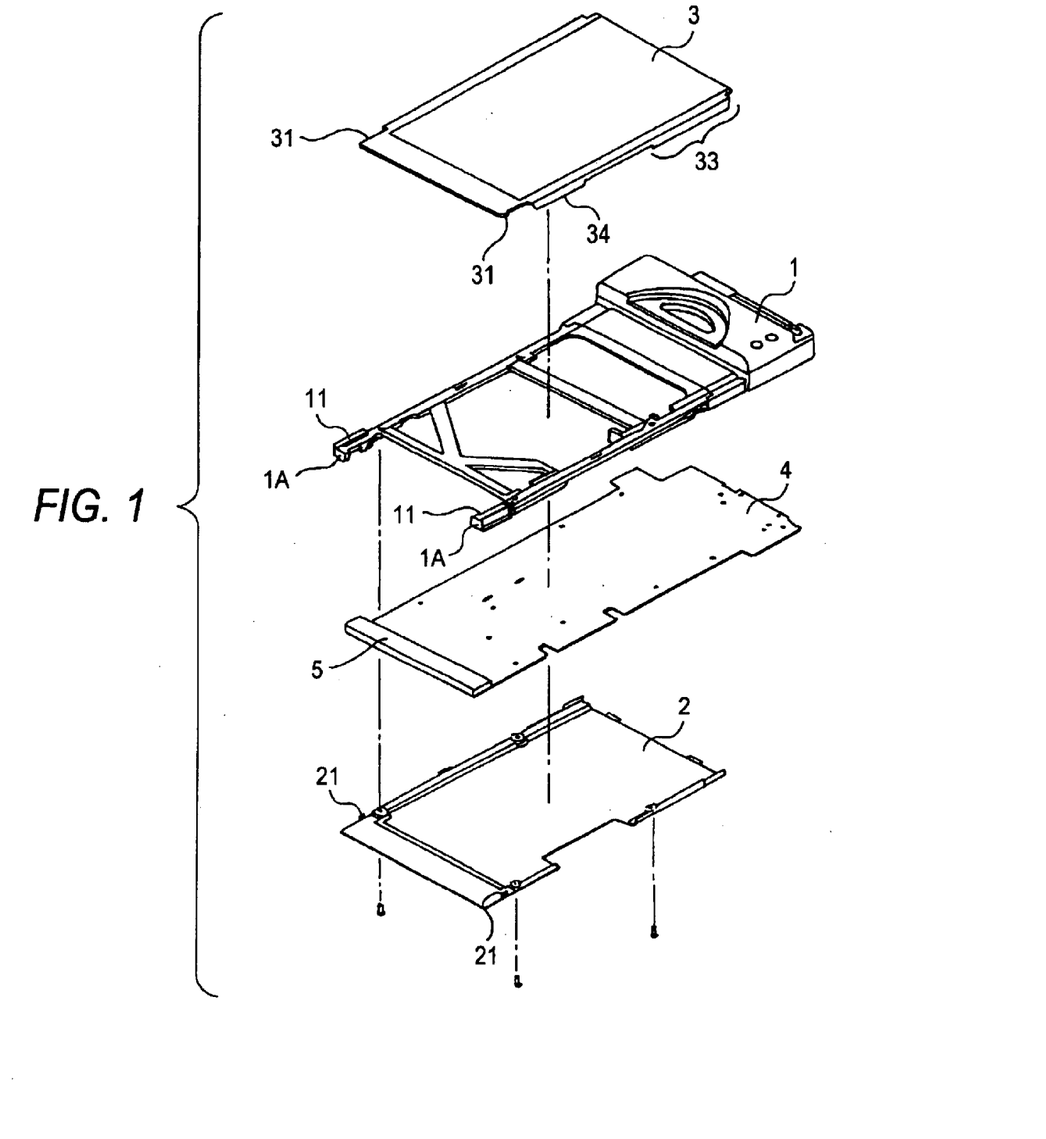
FIG. 1 is an exploded perspective view for showing a PC card according to a first embodiment mode of the present invention.
Figure 2A:
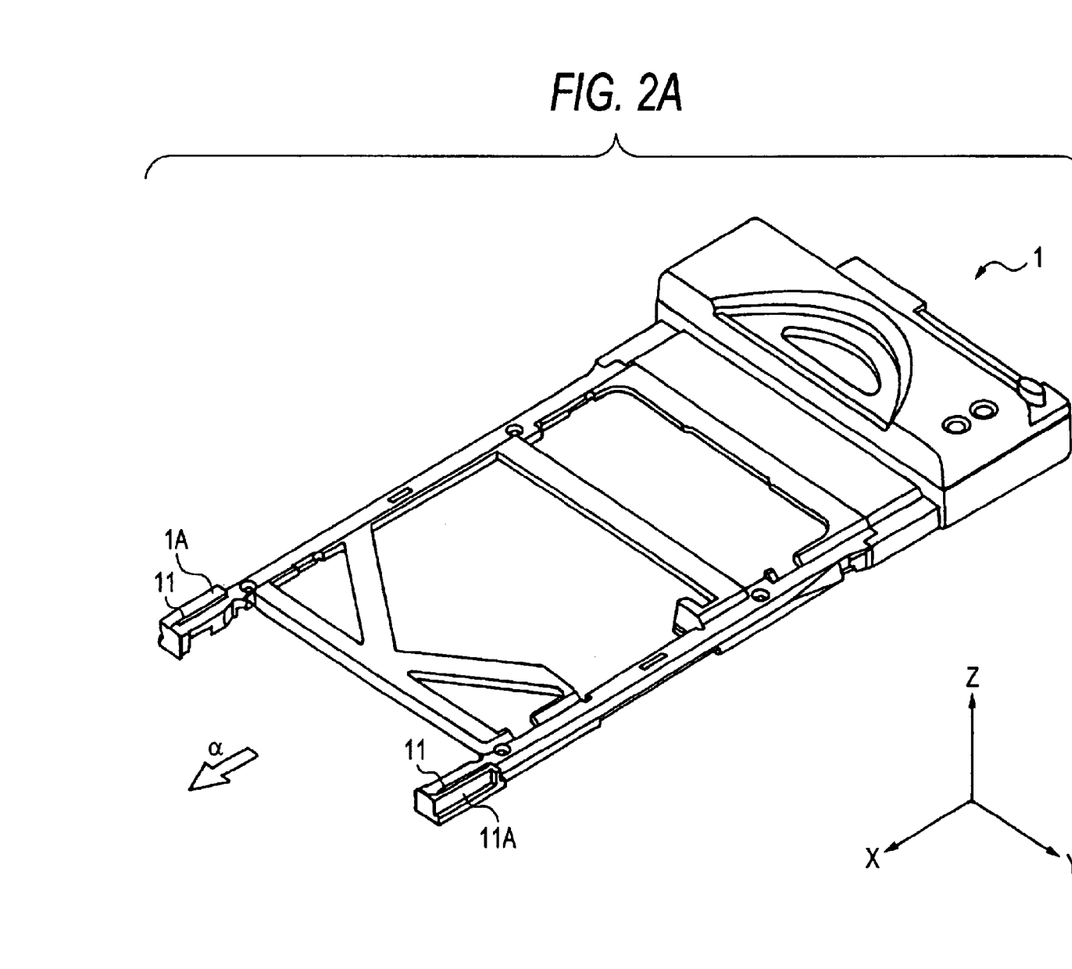
FIG. 2A is a perspective view for indicating a frame of the PC card shown in FIG. 1.
Figure 3A:
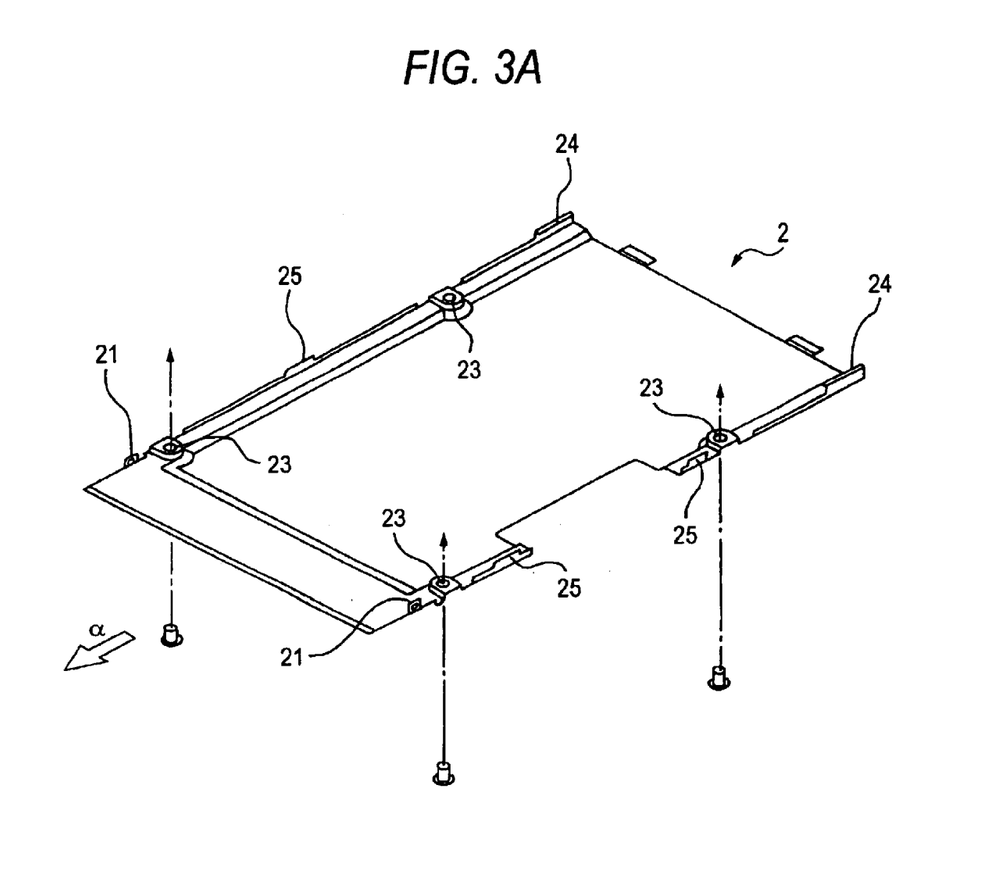
FIG. 3A is a perspective view for showing a lower cover of the PC card indicated in FIG. 1.

FIG. 1 to FIG. 3 illustrate a PC card according to a first embodiment of the present invention. This PC card is inserted into, for example, a slot of a portable (notebook) type personal computer so as to be used for data communications. The PC card is mainly arranged by employing a frame 1 made of synthetic resin, a lower cover 2 made of a metal, an upper cover 3 made of a metal, and a board 4 mounted on the frame 1.

This frame 1 constitutes a main frame of this PC card. The board 4 is sandwiched between this frame 1 and the lower cover 2, and then, the upper cover 3 is mounted thereon from the upper side. Then, in the frame 1, as indicated in FIG. 2A, a slit 11 is formed in an elongated shape along an insertion direction ($\alpha$) on an elongated portion 1A. This elongated portion 1A is elongated from both side portions of tip portions of the insertion direction, and stores/protects a connector 5 (see FIG. 1).

Figure 2B:
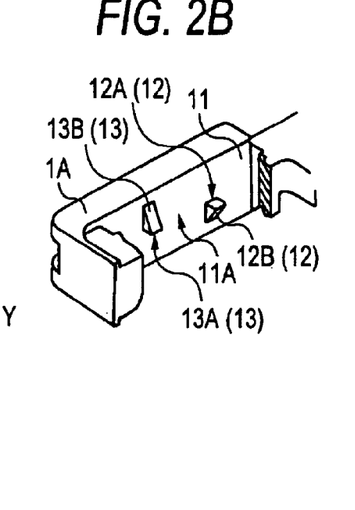
FIG. 2B is an enlarged view for representing a major portion of this frame.

This slit 11 is pierced from an abutting plane between this slit 11 and the upper cover 3 up to another abutting plane between this slit 11 and the lower cover 2. Simply speaking, this slit 11 is pierced under such a condition that the slit 11 is penetrated from the upper portion to the lower portion. The slit 11 owns a substantially rectangular sectional shape. Then, as represented in FIG. 2B, a claw 12 and another claw 13 are formed as engaged portions on an inner surface 11A in this slit 11 at positions which are positionally shifted along a long edge (X) direction of the PC card. This inner surface 11A is directed inwardly among inner surfaces provided on the side of the long edges of the PC card, which are located parallel to the insertion (X) direction of the PC card, and perpendicular to a width (Y) direction of the PC card.

As shown in FIG. 2B, these claw 12 and claw 13 are formed in substantially wedge (triangle pole) shapes provided with raised faces 12A/13A, and tapered faces 12B/13B, respectively. These raised faces 12A and 13A are raised substantially perpendicular to the inner surface 11A. The tapered faces 12B and 13B are inclined along both a depth direction (−Z) and a direction (+Z) opposite to the depth direction. Holes which are opened in insertion projections of both the lower cover 2 and the upper cover 3, respectively, are entered into these claws 12 and 13 from an inclined direction (will be explained later).

It should be understood that a height "h" defined from the inner surfaces 11A on the raised faces 12A/13A of these claws 12/13 is restricted within at least the below-mentioned range:

$$t<h<L-t$$

where symbol "t" indicates a thickness of the lower cover 2 and a thickness of the upper cover 3; and symbol "L" shows a groove width of the slit 11 along a short hand direction.

Figure 3B:
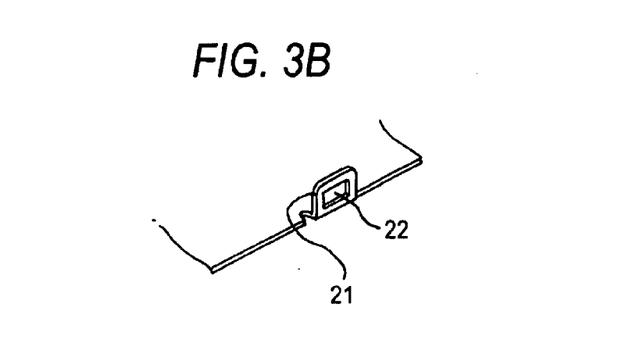
FIG. 3B is an enlarged view for representing a major portion of this lower cover.

The lower cover 2 is made of a thin metal plate which can be elastically deformed. As indicated in FIG. 3A, insertion projections 21 which are inserted into the slit 11 on the side of the frame 1 are formed on both a right side portion and a left side portion of tip portions of this lower cover 2 along the insertion direction ($\alpha$). Also, a hole 22 (see FIG. 3B) is formed in this insertion projection 21. This hole 22 constitutes an engaging portion which is engaged with the claw 12 of the slit 11, while the hole 22 is elastically deformed to be inserted into the slit 11.

Furthermore, 4 pieces of screwing holes 23 are formed in this lower cover 2 near abase edge portion from the insertion projection 21. Also, plural sets of engaging projections 24 and 25 having substantially "L"-shapes are formed on both the base edge portion of this lower cover 2, and also, an intermediate portion between this base edge portion and the tip portion thereof. These engaging projections 24 and 25 are employed in order that both the base edge portion and the intermediate portion of the lower cover 2 are positionally aligned with respect to the frame 1 to be engaged.

Figure 4A:
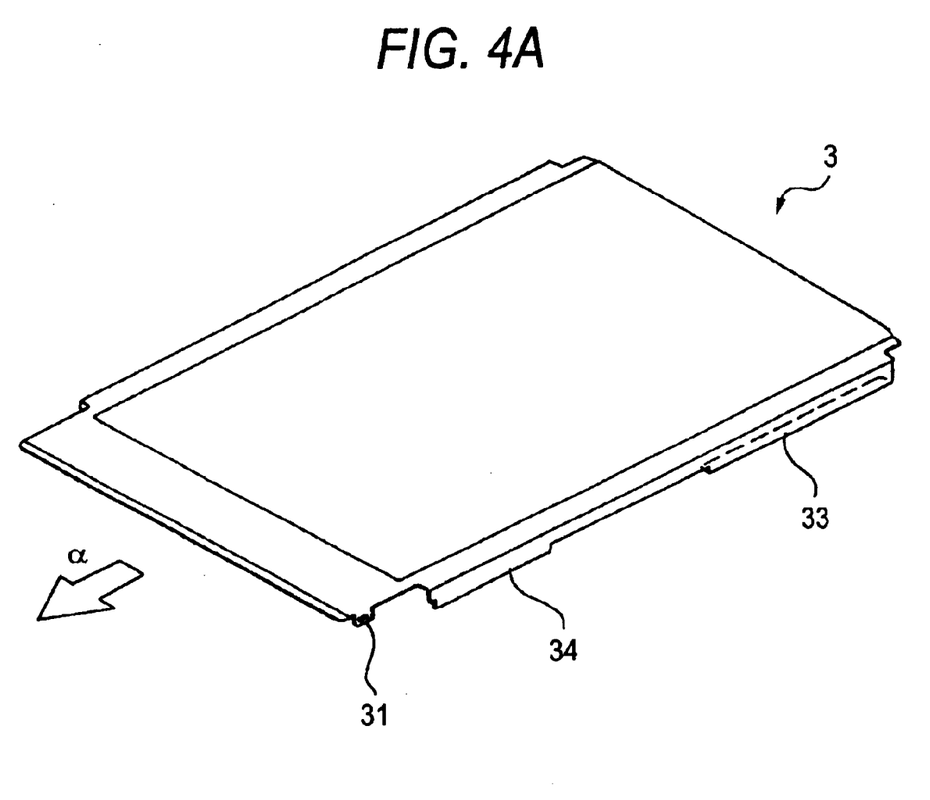
FIG. 4A is a perspective view for showing an upper cover of the PC card indicated in FIG. 1.
Figure 4B:
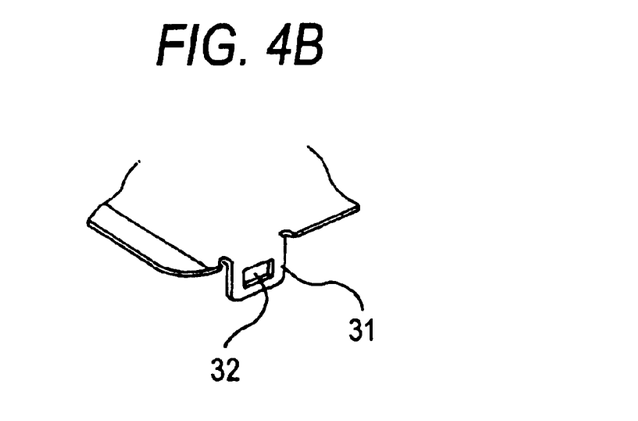
FIG. 4B is an enlarged view for representing a major portion of this upper cover.

Similar to the lower cover 2, the upper cover 3 is made of a thin metal plate which can be elastically deformed. As indicated in FIG. 4A, insertion projections 31, and holes (see FIG. 4B) are formed on both a right side portion and a left side portion of tip portions of this upper cover 3 along the insertion direction ($\alpha$) respectively. The insertion projection 31 is made thinner than a space of the slit 11 on the side of the frame 1. The hole 32 is provided with the upper cover 3, which is engaged with the claw 13 of the slit 11, while the hole 32 is elastically deformed to be inserted into the slit 11. Also, plural sets of engaging projections 33 and 34 having substantially horseshoe shapes (see FIG. 7) are formed on both a base edge portion of this upper cover 3, and also, an intermediate portion between this base edge portion and a tip portion thereof. These engaging projections 33 and 34 are employed in order that both the base edge portion and the intermediate portion of the upper cover 3 are positionally aligned with respect to the frame 1 to be engaged.

Figure 5:
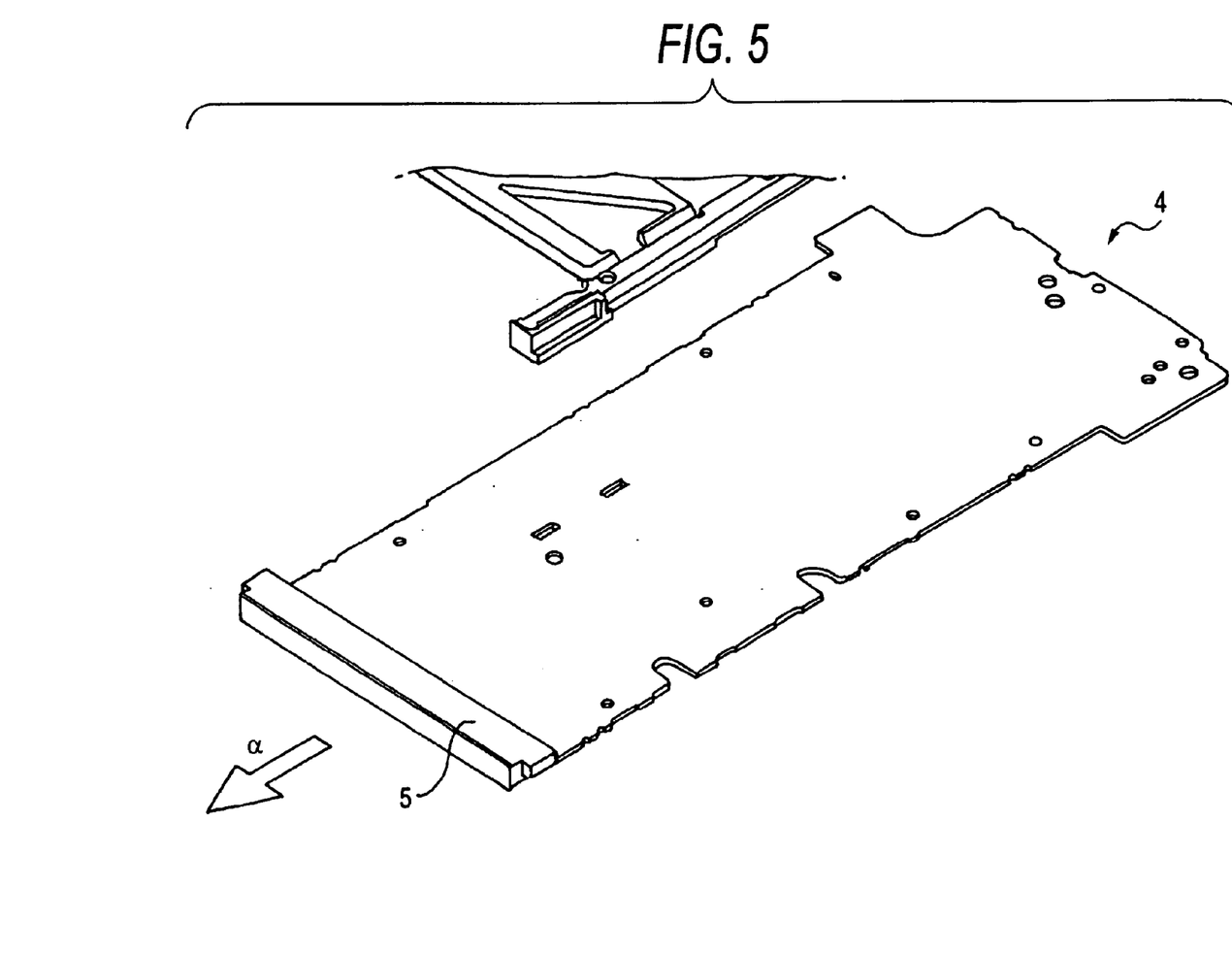
FIG. 5 is a perspective view for indicating a board and a connector of the PC card shown in FIG. 1.

As shown in FIG. 5, various sorts of circuits are mounted on both the upper surface and the lower surface of the board 4, and further, the connector 5 is mounted on the tip portion thereof along the insertion direction (α) of the PC card. This board 4 is grounded via an earth spring (not shown) with respect to both the lower cover 2 and the upper cover 3.

The connector 5 is employed so as to establish an electric conductive condition with respect to a personal computer (not shown) which is used, while the right/left end portions of this connector 5 are stored under such a condition that both the side portions are sandwiched by the elongated portion 1A which is elongated from the tip surface of the frame 1.

Next, operations of this first embodiment mode will now be explained with reference to FIGS. 6A to 6D and FIGS. 7A and 7B.

Figure 7A:
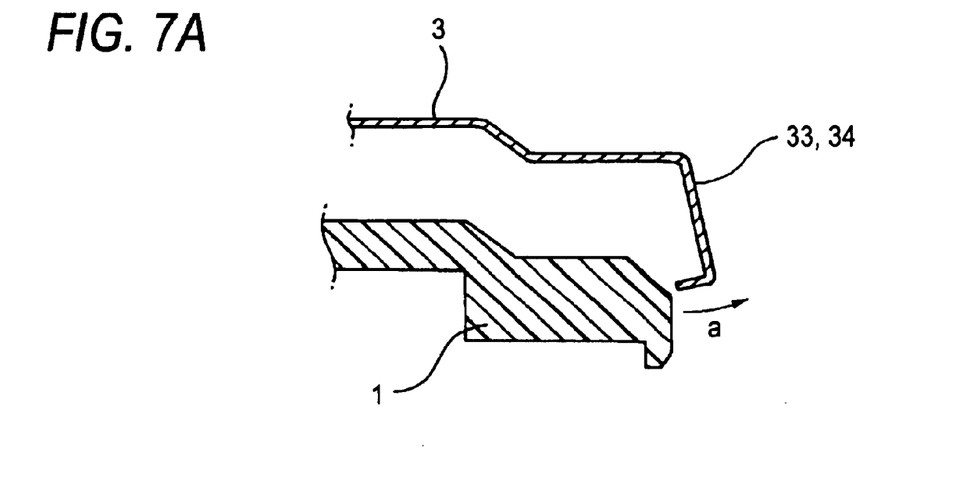
FIGS. 7A and 7B are step diagrams for indicating assembling works of both the frame and the engaging projection of the upper cover of the PC card shown in FIG. 1, according to the first embodiment.
Figure 7B:
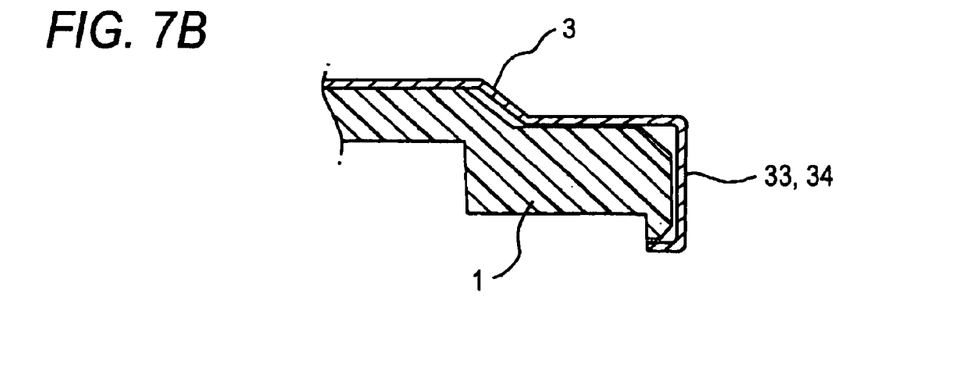

First, the upper cover 3 is mounted on the frame 1. In this case, as shown in FIG. 7A, while the substantially horseshoe shaped engaging projections 33 and 34 which are provided on both the side surfaces of the upper cover 3 are elastically deformed along a direction "a" indicated in this drawing, these engaging projections 33 and 34 are engaged to the frame 1 (see FIG. 7B).

Figure 6A:
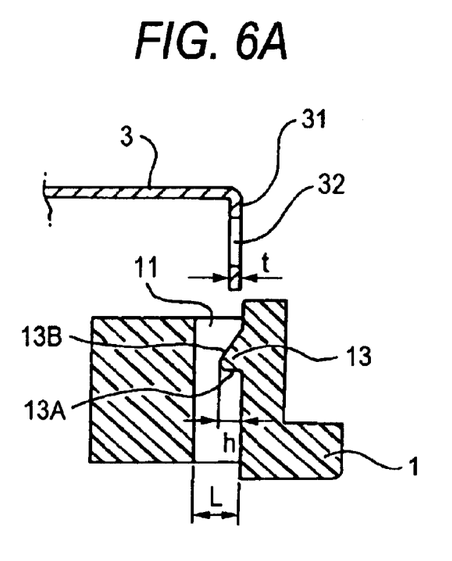
FIGS. 6A to 6D are step diagrams for indicating assembling works of both the frame and the insertion projection of the upper cover of the PC card shown in FIG. 1, according to the first embodiment.
Figure 6B:
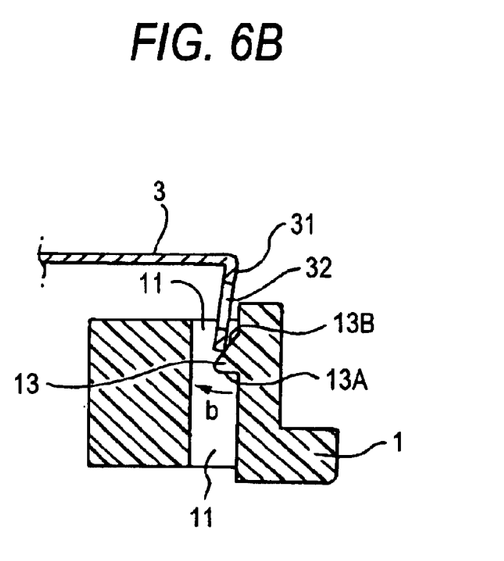
Figure 6C:
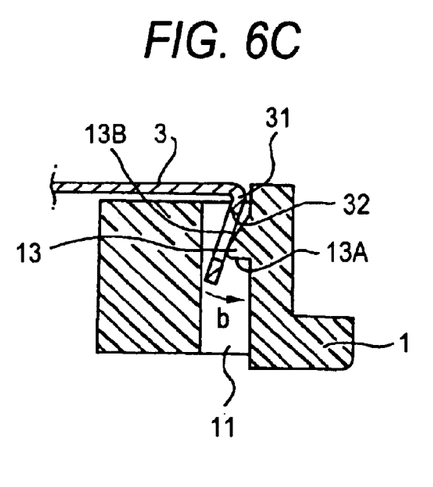

Next, as shown in FIG. 6A, when the insertion projections 31 which are provided on both side surfaces of the upper cover 3 on the side of the tip portion thereof are inserted into the slit 11 and are directly squeezed thereinto, the insertion projection 31 abuts against the tapered face 13B which is formed on the claw 13 for the upper cover 3 (see FIG. 6B). Then, when the insertion projection 31 is furthermore squeezed, this insertion projection 31 is bent, and while this bent insertion projection 32 is elastically deformed, this deformed insertion projection 31 climbs over this claw 13 (see FIG. 6C).

Figure 6D:
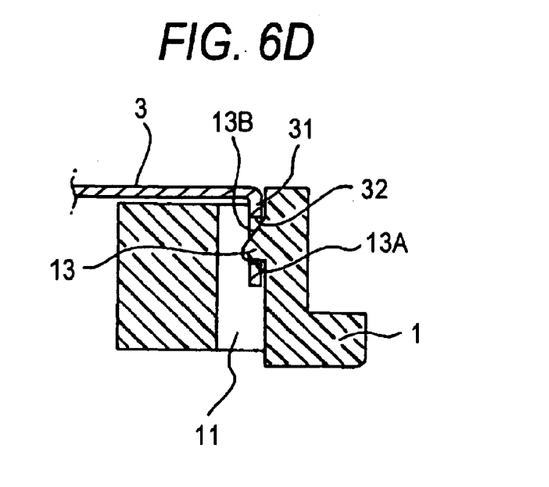

Then, in the case that the tip portion side of this insertion projection 31 has climbed over the claw 13 and then is reached to the raised face 13A, while the insertion projection 31 is returned to the original condition by way of the recovery force, the hole 32 formed in the insertion projection 31 is fitted into the claw 13 so as to be brought into the lock condition (see FIG. 6D).

Thereafter, the board 4 is set to the frame 1 under which the lower cover 2 is mounted on the frame 1. In other words, both the engaging projections 24 and 25 which are formed on both the base end portion and the intermediate portion of the lower cover 2 are engaged to the inner wall surfaces of the peripheral portions which are formed on both the side surfaces of the frame 1 and the upper cover 3.

At the same time, the insertion projection 21 formed on the side of the tip portion is also inserted into the slit 11 of the frame 1, and is directly squeezed thereinto. As a result, similar to the above-described case of the upper case 3, after the tip portion of this insertion projection 21 abuts against the tapered face 12B of the claw 12, while this tip portion is bent along this tapered face 12B, this bent tip portion is elastically deformed.

Then, when the tip portion of this insertion projection 21 climbs over the claw 12, the tip portion of the insertion projection 21 which has been elastically deformed is returned to the original condition due to the recovery force, and thus, the hole 22 formed in the insertion projection 21 is fitted into the claw 12 so as to be brought into the lock condition.

While the board 4 is sandwiched by both the lower cover 2 and the upper cover 3 in the above-described manner, this board 4 is mounted on the frame 1. Thereafter, the board 4 is screwed through a screw hole of the lower cover 2 by a screw, and thus, the lower cover 2 is screwed on the frame 1 so as to be firmly fixed thereon.

As a consequence, in accordance with this embodiment, both the upper cover and the lower cover can be fixed in the integral form under the fasten condition up to the tip portion of the frame 1 which owns no space used for screw-fixing operation. As a result, even when the PC card is repeatedly inserted into a slot of a personal computer, there is no risk that torsion (twists) and exfoliation occur, so that the thermo-compression tape employed in the conventional PC card is no longer required.

Moreover, when malfunction happens to occur, after the screws are loosened to be dismounted, if the insertion projections 21 and 31 in which the holes 22 and 32 are brought into the engaging conditions with respect to the claws 12 and 13 of the frame 1 are caused to come out so as to dismount both the lower cover 2 and the upper cover 3, then the internal portion of this PC card can be opened.

Figure 8A:
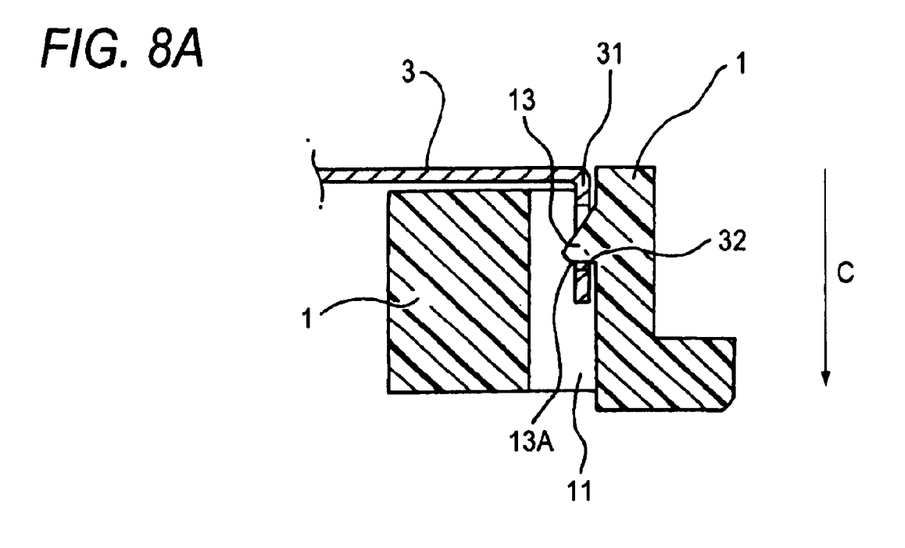
FIG. 8 is an explanatory diagram for explaining operations of the first embodiment.

Also, in accordance with this embodiment, for instance, in FIG. 8A, assuming now that force is applied to the frame 1 along a direction "C," the frame 1 is tried to be moved along this direction "C." However, the hole 32 formed in the insertion projection 31 of the upper cover 3 bumps against the raised face 13A of the claw 13 for the upper cover 3, so that the movement of this frame 1 is restricted. As a consequence, such a problem can be avoided that clearances are made in the tip portion between the frame 1 and the upper cover 3 and thus twists occur.

Figure 8B:
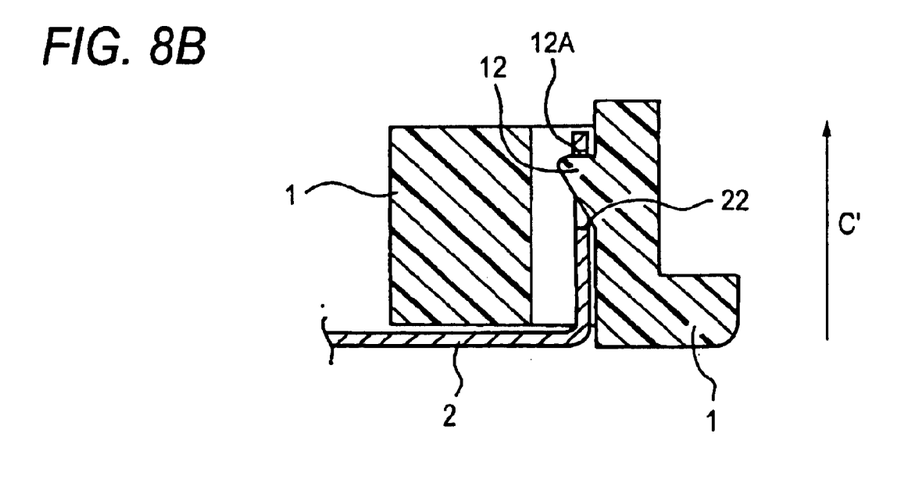

Similarly, for example, in FIG. 8B, even when force is applied to the frame 1 along a direction "C'", the hole 22 formed in the insertion projection 32 of the lower cover 2 bumps against the raised face 12A of the claw 12 for the lower cover 2, so that the movement of this frame 1 is restricted. As a consequence, such a problem can be avoided that clearances are made in the tip portion between the frame 1 and the lower cover 3 and then twists occur.

It should be noted that in this embodiment, the substantially horseshow shaped engaging projections 33 and 34 are formed on the side of the upper cover. Alternatively, the engaging projections may be formed on the side of the lower cover, and the upper cover may be screwed with respect to the frame.

[Embodiment 2]

Next, a second embodiment of the present invention will now be explained with reference to FIGS. 9A to 9C.

Figure 9A:
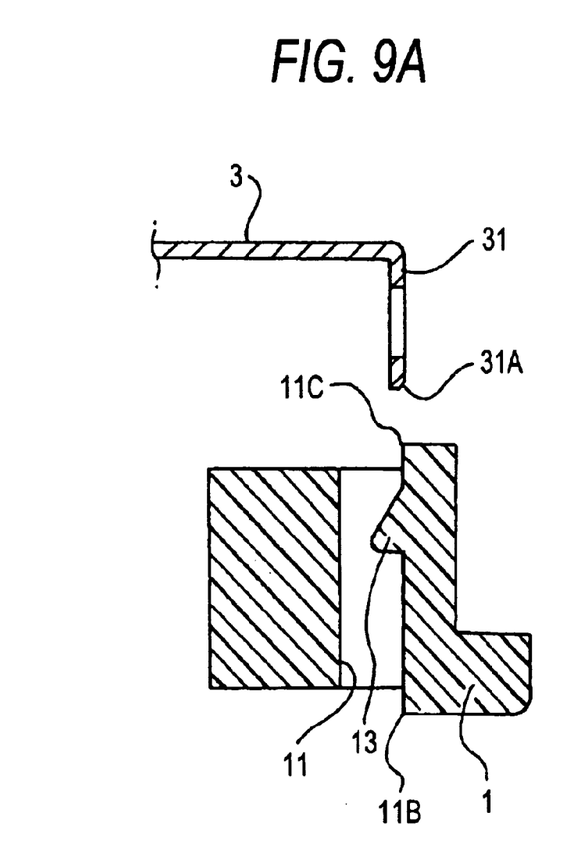
FIG. 9A to FIG. 9C are step diagrams for showing assembling works of a PC card according to a second embodiment of the present invention.
Figure 9B:
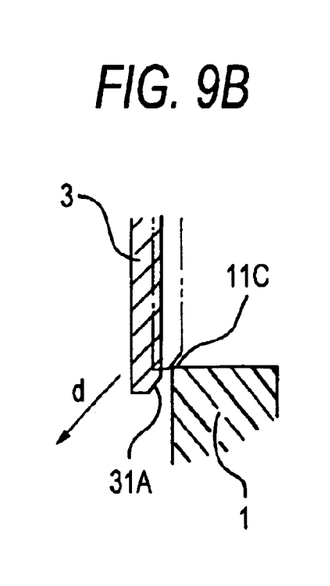
Figure 9C:
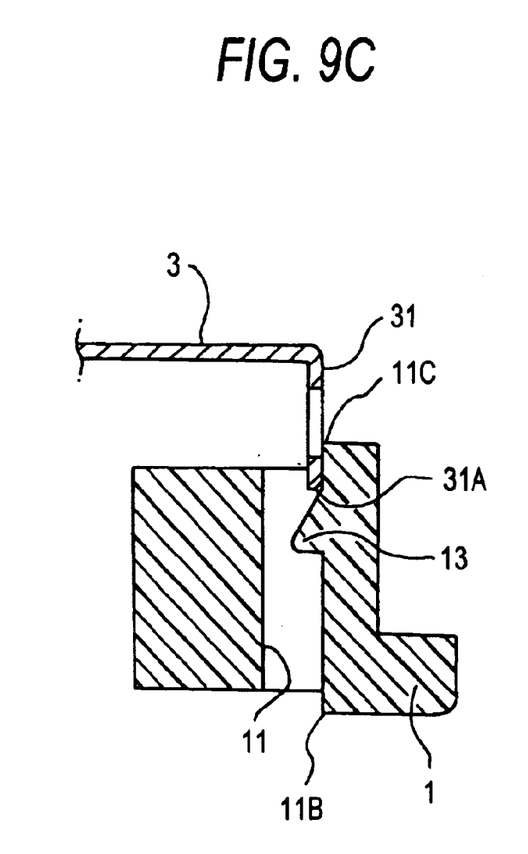

As indicated in FIGS. 9A to 9C, in this second embodiment, an outer face which abuts against the claw 13 of the tip portion of the insertion projection 31 formed on the upper cover 3 is arranged by providing an inclined face 31A, while the outer face is formed in an inclined face by way of a cut to the face process. Also, a similar inclined face is formed at a tip surface of the insertion projection 21 of the lower cover 2.

When tapered faces are formed at slit entrance portions which are opened in both a lower side and an upper side of slits formed in both side portions of the tip portion of the frame 1 made of synthetic resin, workability effected while the insertion projections 21 and 31 are inserted into the edge portions 11B and 11C formed on the side of the inner surfaces can be further improved. These tapered faces are employed so as to smoothly guide the insertion projections 21 and 31 into the slits in such a case that the insertion projections 21 and 31 are inserted into the edge portions 11B and 11C. Also, when such tapered faces are provided on inner peripheral edge portions of the holes 22 and 32 formed in the insertion projections 21 and 31, workability effected in such a case that both the upper cover 3 and the lower cover 2 are dismounted can be improved. These tapered faces are inclined with respect to the thickness direction of these insertion projections 21 and 31, and may guide the disengaging operation from the claws 12 and 13.

Next, operations of this second embodiment will now be explained.

For instance, as shown in FIG. 9A, in such a case that the insertion projection 31 of the upper cover 3 is tried to be inserted into the slit 11 under such a condition that this insertion projection 31 is slightly and positionally shifted with respect to the slit 11, as shown in FIG. 9B, the inclined face 31A bumps against the edge portion of the inner surface 11A of the slit 11, while being made in contact with this edge portion of the inner surface 11A.

Then, if the insertion projection 31 is furthermore squeezed under this condition, the tip portion of the insertion projection 31 may be guided along a direction "d" (see FIG. 9B) where the slit 11 is located by receiving component force exerted in a direction along the inclined face 31A among the squeezing force. As a result, while the tip portion of the insertion projection 31 is elastically deformed along the direction "d", this insertion projection 31 may be smoothly entered into the inside of this slit 11 (see FIG. 9C).

Also, since such an inclined face 31A is formed on the tip portion of the insertion projection 31, even when the tip portion of this insertion projection 31 bumps against the claw 13, the insertion projection 31 may be moved/guided along this inclined face 13B of the claw 13 in a similar manner to the above-described case. As a result, it is possible to avoid such a fact that stress is concentrated onto the inclined face 13B of the claw 13 so as to give actions thereto.

It should also be noted that although the construction of the upper cover 3 has been explained in the above embodiment, a similar operation may be achieved even in the lower cover 2.

As a consequence, in accordance with this second embodiment, the workability effected when the insertion projection 31 is inserted can be improved, and furthermore, such a trouble that the various structural elements are destroyed during this insertion operation can be prevented.

As previously explained, in accordance with the present invention, the PC card is equipped with the slits formed in such a manner that the slits are penetrated from the abutting plane between the side portion of the frame and the upper cover up to the abutting plane between the side portion of the frame and the lower cover; the engaged portions used for both the upper cover and the lower cover, which are formed on the inner wall surfaces of the slits; the insertion projec-tions inserted into the slits; and also the engaging portions which are provided on the respective insertion projections of both the upper cover and the lower cover and are inserted into the slits so as to be engaged with the engaged portions. Since the upper cover and the lower cover can be joined to the frame of the PC card without using the thermo-compression tape, when this PC card is repaired due to malfunction thereof, this PC card can be simply decomposed to open the internal constructions of the PC card.

What is claimed is:

1. A PC card to be inserted into an electronic appliance, comprising:

a frame made of synthetic resin;

a board held by said frame, on which a circuit component and a connector connectable with the electronic appliance are mounted;

an upper cover made of metal, said upper cover which covers an upper side of said flame;

a lower cover made of metal, said lower cover which covers a lower side of said frame;

slits formed to be penetrated from an abutting plane between said upper cover and side portions of said frame up to another abutting plane between said lower cover and the side portions of said frame;

engaged portions for said upper cover and said lower cover, provided on inner wall surfaces said slits;

insertion projections provided on said, upper cover and said lower cover, respectively, and said insertion projections inserted into said slits; and engaging portions provided on said insertion projections of said upper cover and said lower cover, respectively, and said engaging portions inserted into said slits to be engaged with said engaged portions, wherein said engaged portion is constructed of a substantially triangle-pole-shaped claw, and wherein said engaging portion is a hole fitted into the claw.

2. The PC card as claimed in claim 1, wherein said claw includes:

an inclined face for guiding the insertion operation of the insertion projection; and a raised face for engaging the inserted hole, located perpendicular to an inner surface of the slit.

3. The PC card as claimed in claim 2, wherein a tapered face is formed on an inner peripheral edge portion of the hole of said insertion projection, and the tapered face is inclined with respect to a thickness direction of said insertion projection for guiding a dismounting operation from said claw.

4. The PC card as claimed in claim 1, wherein a tapered face is formed on an inner peripheral edge portion of the hole of said insertion projection, said tapered face is inclined with respect to a thickness direction of said insertion projection for guiding a dismounting operation from said claw.

* * * * *